(12) United States Patent
Kim et al.

(10) Patent No.: US 10,896,943 B2
(45) Date of Patent: Jan. 19, 2021

(54) DISPLAY DEVICE

(71) Applicant: Samsung Display Co., Ltd., Yongin-si (KR)

(72) Inventors: Min-Sung Kim, Hwaseong-si (KR); Thanh Tien Nguyen, Seoul (KR); Jae Seob Lee, Seoul (KR); Ki Ju Im, Suwon-si (KR)

(73) Assignee: SAMSUNG DISPLAY CO., LTD., Yongin (KR)

( * ) Notice: Subject to any disclaimer, the term of this patent is extended or adjusted under 35 U.S.C. 154(b) by 194 days.

(21) Appl. No.: 15/376,412

(22) Filed: Dec. 12, 2016

(65) Prior Publication Data

US 2017/0170253 A1 Jun. 15, 2017

(30) Foreign Application Priority Data

Dec. 14, 2015 (KR) .................. 10-2015-0178242

(51) Int. Cl.
*H01L 27/32* (2006.01)
*H05B 33/02* (2006.01)
(Continued)

(52) U.S. Cl.
CPC .......... *H01L 27/3267* (2013.01); *G06F 3/041* (2013.01); *H01L 27/3276* (2013.01); *H01L 51/0097* (2013.01); *H01L 51/5253* (2013.01); *H05B 33/02* (2013.01); *H05B 33/10* (2013.01); *G09G 3/3225* (2013.01); *G09G 3/3266* (2013.01); *G09G 3/3275* (2013.01); *G09G 2380/02* (2013.01); *H01L 27/323* (2013.01);
(Continued)

(58) Field of Classification Search
CPC . H01L 51/0097; H01L 27/3276; H05B 33/02; H05B 33/10; G06F 3/041
See application file for complete search history.

(56) References Cited

U.S. PATENT DOCUMENTS

| | | |
|---|---|---|
| 2013/0076649 A1 | 3/2013 | Myers et al. |
| 2014/0049449 A1* | 2/2014 | Park .................. G09G 5/00 345/1.3 |

(Continued)

FOREIGN PATENT DOCUMENTS

| | | |
|---|---|---|
| KR | 10-2014-0024191 A | 2/2014 |
| KR | 10-1385458 B1 | 4/2014 |

(Continued)

*Primary Examiner* — Ermias T Woldegeorgis
(74) *Attorney, Agent, or Firm* — F. Chau & Associates, LLC

(57) ABSTRACT

A display device is disclosed. In one aspect, the display device includes a flexible substrate including a first region, a second region separated from the first region, and a bending region positioned between the first and second regions. The bending region is configured to be bent so as to have a plurality of different curvatures depending on degrees of bending of the flexible substrate. The display device also includes a first display unit positioned in the first region, a second display unit separated from the first display unit and positioned in the second region and an encapsulation layer positioned over the flexible substrate with the first and second display units interposed therebetween. The encapsulation layer directly contacts the bending region of the flexible substrate.

21 Claims, 9 Drawing Sheets

(51) Int. Cl.
*G06F 3/041* (2006.01)
*H01L 51/00* (2006.01)
*H05B 33/10* (2006.01)
*H01L 51/52* (2006.01)
G09G 3/3225 (2016.01)
G09G 3/3266 (2016.01)
G09G 3/3275 (2016.01)

(52) U.S. Cl.
CPC ...... *H01L 51/5237* (2013.01); *H01L 51/5281* (2013.01); *H01L 2251/5338* (2013.01)

(56) References Cited

U.S. PATENT DOCUMENTS

2014/0098471 A1* 4/2014 Nam ............... G06F 1/1626
  361/679.01
2014/0183473 A1* 7/2014 Lee ............... H01L 27/3244
  257/40
2014/0354143 A1* 12/2014 Jung ............... H01L 27/3276
  313/511

FOREIGN PATENT DOCUMENTS

| KR | 10-2014-0052713 A | 5/2014 |
| KR | 10-2014-0066253 A | 5/2014 |
| KR | 10-2014-0072999 A | 6/2014 |
| KR | 10-2014-0142090 A | 12/2014 |

\* cited by examiner

DISPLAY DEVICE

RELATED APPLICATIONS

This application claims priority to and the benefit of Korean Patent Application No. 10-2015-0178242 filed in the Korean Intellectual Property Office on Dec. 14, 2015, the entire contents of which are incorporated herein by reference.

BACKGROUND

Field

The described technology generally relates to a display device.

Description of the Related Technology

A display device generates and displays an image (or a sequence of images as in video), and recently, organic light-emitting diode (OLED) technology has received attention for use in new display products.

Unlike a liquid crystal display, an OLED display is self-emissive and does not require a separate light source, and thus in can be made relatively thinner and lighter for a given screen size.

In general, an OLED display includes a substrate covered by pixel circuits that emit light. In the most basic of pixel circuits, a thin film transistor (TFT) is positioned over the substrate, and an OLED is electrically connected to the TFT.

Recently, a flexible OLED display has been developed in which a flexible substrate is formed of a polymer material and at least a part of the flexible substrate is bendable.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

One inventive aspect relates to a display device that suppresses defects from being generated in a bending part.

Another aspect is a display device including: a flexible substrate including a first region, a second region separated from the first region, and a bending region positioned between the first region and the second region and selectively having a curvature; a first display unit positioned in the first region; and a second display unit separated from the first display unit and positioned in the second region.

An encapsulation part positioned on the flexible substrate and sealing the first display unit and the second display unit along with the flexible substrate may be further included.

The encapsulation part may directly contact the bending region of the flexible substrate.

The first display unit may include a plurality of first organic light-emitting elements, and a first scan driver connected to the plurality of first organic light-emitting elements, while the second display unit may include a plurality of second organic light-emitting elements, and a second scan driver connected to the plurality of second organic light-emitting elements.

The first scan driver may be positioned on an end part of the first display unit, and the second scan driver may be positioned on an end part of the second display unit.

A connection part positioned on a part of the bending region and connecting the first scan driver and the second scan driver may be further included.

The connection part may be positioned on an end part of the bending region.

The first display unit may have a larger area than the second display unit.

There may be a plurality of first scan drivers, and the plurality of first scan drivers may be separated from each other via the plurality of first organic light-emitting elements.

A data driver positioned on the flexible substrate and respectively connected to the first display unit and the second display unit may be further included.

The first scan driver and the second scan driver may be respectively connected to the data driver.

A data driver positioned on the flexible substrate and respectively connected to the first display unit and the second display unit may be further included.

There may be a plurality of second regions, there may be a plurality of bending regions, and there may be a plurality of second display units, and the plurality of second display units may be separated from each other via at least one among the plurality of bending regions to be respectively positioned in the plurality of second regions.

There are two second regions, there are two bending regions, there are two second display units, and the two second display units are separated from each other via two bending regions and the first display unit and may be respectively positioned in two second regions.

The first display unit and the second display unit may respectively display the image in different directions from each other.

The display device may further include: a polarizer positioned on the first display unit and the second display unit; a touch part positioned on the first display unit and the second display unit; and a window positioned on the first display unit and the second display unit.

Further, the present invention provides a flexible substrate including a bending region having a curvature, and a plurality of display units not overlapping the bending region on the flexible substrate and respectively including at least one scan driver.

An encapsulation part positioned on the flexible substrate and sealing the plurality of display units along with the flexible substrate may be further included.

The encapsulation part may directly contact the bending region of the flexible substrate.

The plurality of display units may include a plurality of organic light-emitting elements, and at least one scan driver connected to the plurality of organic light-emitting elements.

Each of scan drivers of the plurality of display units may be connected directly to each other.

Another aspect is a display device comprising: a flexible substrate including a first region, a second region separated from the first region, and a bending region positioned between the first and second regions, wherein the bending region is configured to be bent so as to have a plurality of different curvatures; a first display unit positioned in the first region; a second display unit separated from the first display unit and positioned in the second region; and an encapsulation layer positioned over the flexible substrate with the first and second display units interposed therebetween, wherein the encapsulation layer directly contacts the bending region of the flexible substrate.

In the above display device, the first display unit includes: a plurality of first organic light-emitting elements; and a first scan driver electrically connected to the first organic light-emitting elements, and wherein the second display unit includes: a plurality of second organic light-emitting elements; and a second scan driver electrically connected to the second organic light-emitting elements. In the above display device, the first scan driver is positioned over an end portion of the first display unit, and wherein the second scan driver is positioned over an end portion of the second display unit. The above display device further comprises a connector positioned over a portion of the bending region and connecting the first and second scan drivers.

In the above display device, the connector is positioned over an end portion of the bending region. In the above display device, the first display unit has a larger area than the second display unit. In the above display device, the first scan driver comprises a plurality of scan drivers separated from each other via the first organic light-emitting elements. The above display device further comprises a data driver positioned over the flexible substrate and electrically connected to the first and second display units. In the above display device, the first and second scan drivers are electrically connected to the data driver. The above display device further comprises a data driver positioned over the flexible substrate and electrically connected to the first and second display units.

In the above display device, the second region comprises a plurality of second regions, wherein the bending region comprises a plurality of bending regions, wherein the second display unit comprises a plurality of display units separated from each other via at least one of the bending regions to be respectively positioned in the second regions. In the above display device, the first and second display units are configured to respectively display images in different directions from each other. The above display device further comprises: a polarizer positioned over the first and second display units; a touch layer positioned over the first and second display units; and a window positioned over the first and second display units.

Another aspect is a display device comprising: a flexible substrate including a bending region, wherein the bending region is configured to be bent so as to have a plurality of different curvatures depending on degrees of bending of the flexible substrate; and a plurality of display units not overlapping the bending region in a direction of the thickness of the flexible substrate, wherein each of the display units includes at least one scan driver.

The above display device further comprises an encapsulation layer positioned over the flexible substrate and sealing the display units along with the flexible substrate. In the above display device, the encapsulation layer directly contacts the bending region of the flexible substrate. In the above display device, each of scan drivers is directly connected to each other.

Another aspect is a display device comprising: a flexible substrate including a bending region, wherein the bending region is configured to be bent so as to have a plurality of different curvatures; first and second display units disposed over the flexible substrate not to overlap the bending region in a direction of the thickness of the flexible substrate; and an encapsulation layer positioned over the first and second display units, wherein the encapsulation layer directly contacts the bending region of the flexible substrate.

In the above display device, the bending region is formed between the first and second display units. In the above display device, the encapsulation layer includes a first portion that overlaps the bending region in the direction of the thickness of the flexible substrate and a second portion that overlaps the first and second display units in the direction of the thickness of the flexible substrate, and wherein the first region has a top surface that is closer to the flexible substrate than a top surface of the second region.

According to at least one of the disclosed embodiments, the display device in which the defect is suppressed from being generated in the bending part is provided.

DETAILED DESCRIPTION OF CERTAIN INVENTIVE EMBODIMENTS

Figure 1:
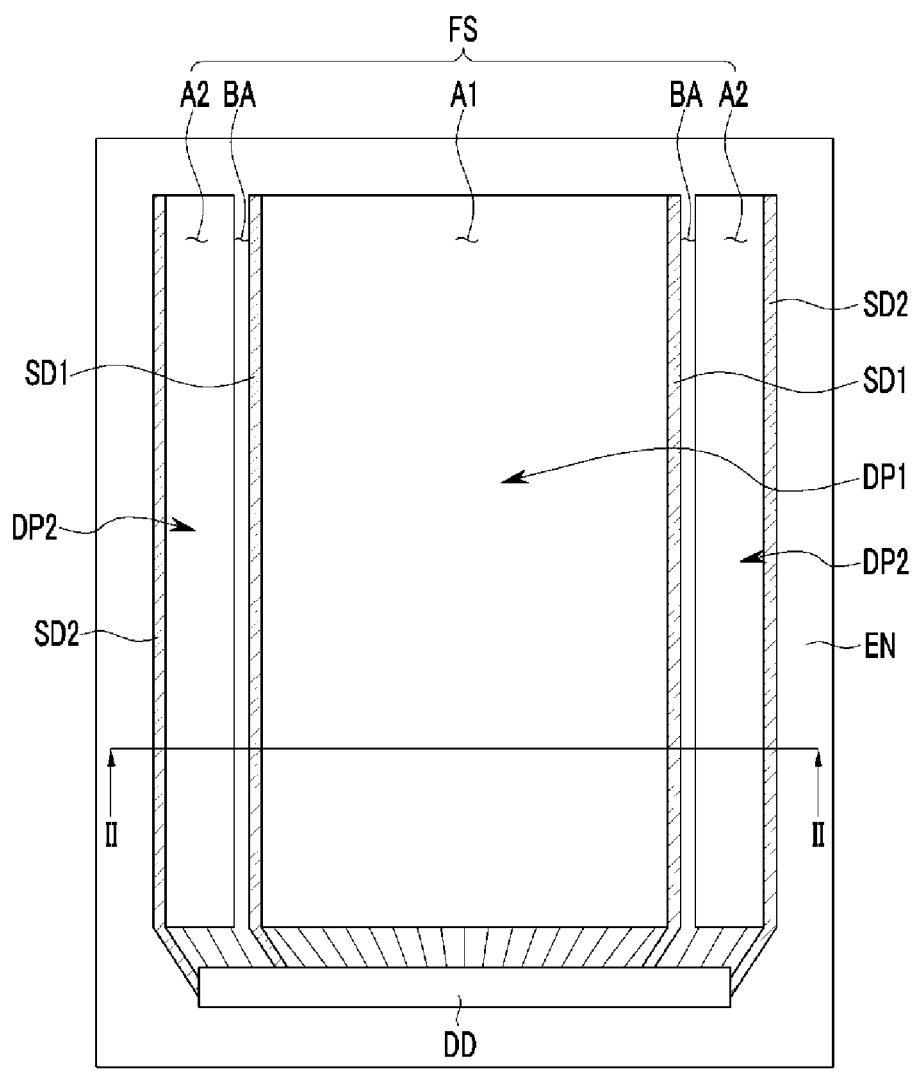
FIG. 1 is a top plan view of a display device according to an exemplary embodiment.

Embodiments will be described more fully hereinafter with reference to the accompanying drawings. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Further, in exemplary embodiments, since like reference numerals designate like elements having the same configuration, a first exemplary embodiment is representatively described, and in other exemplary embodiments, only configurations different from the first exemplary embodiment will be described.

In addition, the size and thickness of each element shown in the drawings are arbitrarily shown for better understanding and ease of description, but the present invention is not limited thereto.

In the drawings, the thickness of layers, films, panels, regions, etc., are exaggerated for clarity. In the drawings, for better understanding and ease of description, the thicknesses of some layers and areas are exaggerated.

In this disclosure, the term "substantially" includes the meanings of completely, almost completely or to any significant degree under some applications and in accordance with those skilled in the art. Moreover, "formed, disposed over positioned over" can also mean "formed, disposed or positioned on." The term "connected" includes an electrical connection.

Next, a display device according to an exemplary embodiment will be described with reference to FIG. 1 to FIG. 4.

Hereafter, an OLED display including an organic light-emitting element will be described as one example of the display device. However, if the display device according to another exemplary embodiment includes the display unit displaying the image and the flexible substrate, various display devices such as liquid crystal displays (LCDs), plasma displays (PDs), field emission displays (FEDs), electrophoretic displays (EPDs), electrowetting displays (EWDs), and the like may be used.

Figure 2:
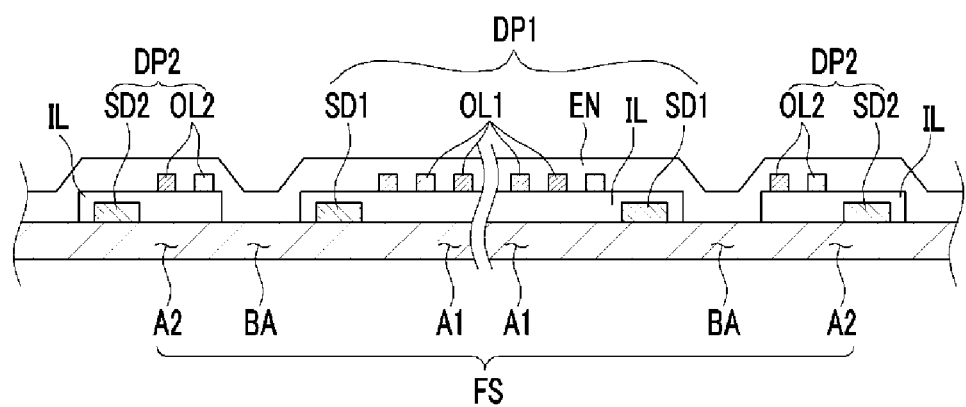
FIG. 2 is a cross-sectional view taken along a line II-II of FIG. 1.

FIG. 1 is a top plan view of a display device according to an exemplary embodiment. FIG. 2 is a cross-sectional view taken along a line II-II of FIG. 1.

As shown in FIG. 1 and FIG. 2, the display device includes a flexible substrate FS, a first display unit DP1, a second display unit DP2, a data driver DD, and an encapsulation part or encapsulation layer EN.

The flexible substrate FS is flexible, such that the entire display device may be flexible.

The flexible substrate FS may include at least one of a polymer material such as a polyimide, a metal material, and an inorganic material, but is not limited thereto, and may include any material which is bendable. The flexible substrate FS may have a form of a film. For example, the flexible substrate FS may include a polymer material such as polyimide (PI), polycarbonate (PC), polyethersulfone (PES), polyethylene terephthalate (PET), polyethylene naphthalate (PEN), polyarylate (PAR), and fiberglass reinforced plastic (FRP).

The flexible substrate FS includes a first region A1, a second region A2, and a bending region BA.

The first region A1 may be a center region of the flexible substrate FS, however it is not limited thereto, and it may be an outer region of the flexible substrate FS. The first region A1 may be wider than the second region A2, however it is not limited thereto, and the first region A1 may have an area that is equal to or smaller than the second region A2.

The second region A2 is separated from the first region A1 via the bending region BA interposed therebetween. The second region A2 may be the outer region of the flexible substrate FS, however it is not limited thereto, and it may be the center region of the flexible substrate FS. There may be a plurality of second regions A2, and the second regions A2 may be separated from the first region A1 via the bending region BA neighboring the first region A1.

In FIG. 1, there are two second regions A2 of the flexible substrate FS, however it is not limited thereto, and there may be one or at least three second regions A2 in another exemplary embodiment.

The bending region BA is positioned between the first region A1 and the second region A2 and may selectively have a curvature. In some embodiments, there are a plurality of bending regions BA, and the bending regions BA are separated from each other via the first region A1 interposed therebetween. The bending regions BA are respectively positioned between the first region A1 and the second region A2. The bending region BA may be bent in one direction, and when the bending region BA is bent, the bending region BA has a curvature corresponding to the bending degree. For example, the bending region BA may have multiple different curvatures depending on the degree of the display device being bent. The bending region BA may not overlap the first display unit DP1 or the second display unit DP2 in the direction of the thickness of the flexible substrate FS, and the bending region BA directly contacts the encapsulation part EN.

The first display unit DP1 is positioned at the first region A1 of the flexible substrate FS. The first display unit DP1 has a wider area than the second display unit DP2, however it is not limited thereto, and the first display unit DP1 may have a smaller area than the second display unit DP2 or may have the same area as the second display unit DP2.

The first display unit DP1 includes a plurality of first organic light-emitting elements OL1, and a first scan driver SD1 connected to the first organic light-emitting elements OL1.

The first organic light-emitting element OL1 includes two electrodes facing each other and an organic emission layer disposed between the two electrodes. Also, the first organic light-emitting element OL1 may be connected to a pixel circuit including a plurality of thin film transistor and at least one capacitor that are not shown, and the pixel circuit may be connected to at least one scan line and at least one data line that are not shown. The detailed shape of the first organic light-emitting element OL1, the detailed shape of the pixel circuit, and each detailed shape of the scan line and the data line may have variously disclosed shapes. The first organic light-emitting element OL1 may form a pixel that is a minimum unit displaying an image.

The first scan driver SD1 may be connected to the first organic light-emitting elements OL1, and supplies a scan signal to each of the first organic light-emitting elements OL1 through the described scan line. The first scan driver SD1 is covered by a single-layered or multi-layered insulating layer IL, however it is not limited thereto, and it may be exposed. The first scan driver SD1 may include at least one thin film transistor, and the thin film transistor included in the first scan driver SD1 may have variously disclosed shapes.

There are a plurality of first scan drivers SD1, and the first scan drivers SD1 are respectively disposed on both end parts of the first display unit DP1. The first scan drivers SD1 are separated from each other via the plurality of first organic light-emitting elements OL1 interposed therebetween.

Meanwhile, in an exemplary embodiment, the first scan driver SD1 is disposed on the end part of the first display unit DP1, however it is not limited thereto, and the first scan driver SD1 may be disposed inside the first display unit DP1.

The first organic light-emitting elements OL1 and the first scan drivers SD1 are respectively connected to the data driver DD.

On the other hand, in an exemplary embodiment, the first scan driver SD1 is connected to the data driver DD, however it is not limited thereto, and in another exemplary embodiment, the first scan driver SD1 may be connected to a printed circuit board (PCB) through a pad that is different from the data driver DD.

The second display unit DP2 is separated from the first display unit DP1 and is disposed in the second region A2 of the flexible substrate FS. The second display unit DP2 has a smaller area than the first display unit DP1, however it is not limited thereto, and the second display unit DP2 may have a wider area than the first display unit DP1 or may have an area that is equal to that of the first display unit DP1.

The second display unit DP2 includes a plurality of second organic light-emitting elements OL2, and a second scan driver SD2 connected to the second organic light-emitting elements OL2.

The second organic light-emitting element OL2 includes two electrodes facing each other, and the organic emission layer disposed between the two electrodes. Also, the second organic light-emitting element OL2 may be connected to the pixel circuit including a plurality of thin film transistor and at least one capacitor that are not shown, and the pixel circuit may be connected to at least one scan line and at least one data line. The detailed shape of the second organic light-emitting element OL2, the detailed shape of the pixel circuit, and each detailed shape of the scan line and the data line may have variously disclosed shapes. The second organic light-emitting element OL2 may form a pixel that is a minimum unit displaying the image.

The second scan driver SD2 may be connected to the second organic light-emitting elements OL2, and supplies the scan signal to each of the second organic light-emitting elements OL2 through the described scan line. The second scan driver SD2 is covered by a single-layered or multi-layered insulating layer IL, however it is not limited thereto, and it may be exposed. The second scan driver SD2 may include at least one thin film transistor, and the thin film transistor included in the second scan driver SD2 may have variously disclosed shapes.

The second scan driver SD2 is disposed on the end part of the second display unit DP2.

Meanwhile, in an exemplary embodiment, the second scan driver SD2 is disposed on the end part of the second display unit DP2, however it is not limited thereto, and the second scan driver SD2 may be disposed inside the second display unit DP2.

The second organic light-emitting elements OL2 and second scan drivers SD1 are respectively connected to the data driver DD.

On the other hand, in an exemplary embodiment, the second scan driver SD2 is connected to the data driver DD, however it is not limited thereto, and in another exemplary embodiment, the second scan driver SD2 may be connected to the printed circuit board (PCB) through the pad that is different from the data driver DD.

As described above, by forming the plurality of second regions A2, the plurality of bending regions BA, and the plurality of second display units DP2, the plurality of second display units DP2 are separated from each other via at least one among the plurality of bending regions BA, and are respectively positioned in each of the second regions A2. In detail, as there are two second regions A2 of the flexible substrate FS, there are two bending regions BA and two second display units DP2, and the two second display units DP2 are separated from each other via the two bending regions BA and the first display unit DP1 and are respectively positioned in the two second regions A2.

The data driver DD is connected to the first display unit DP1 and the second display unit DP2, and respectively supplies the data signal to the first display unit DP1 and the second display unit DP2 through the data line. By the data signal supplied from the data driver DD and the scan signal supplied from the data signal and first scan driver SD1, the first organic light-emitting elements OL1 may be emitted, and the second organic light-emitting elements OL2 may be emitted by the data signal supplied from the data driver DD and the scan signal supplied from the second scan driver SD2. The data driver DD may be a type of a chip-on-film (COF) or a chip-on-glass (COG) in which a driver IC chip is mounted on the flexible substrate FS, however it is not limited thereto, and it be of various types. The data driver DD may be connected to the printed circuit board (PCB) through another pad connected to the data driver DD.

As described above, as the first organic light-emitting elements OL1 of the first display unit DP1 are emitted by the signals supplied by the data driver DD and the first scan driver SD1 and the second organic light-emitting elements OL2 of the second display unit DP2 are emitted by the signals supplied from the data driver DD and the second scan driver SD2, the first display unit DP1 and the second display units DP2 may display different images from each other, or the same images.

The encapsulation part EN is disposed over the flexible substrate FS with the first and second display units DP1 and DP2 interposed therebetween, and seals the display units DP1 and DP2 along with the flexible substrate FS. The encapsulation part EN may be formed of a thin film encapsulation part. The encapsulation part EN may include an organic layer and an inorganic layer disposed on the organic layer. For example, the encapsulation part EN may include at least one organic layer and at least one inorganic layer that are alternately deposited, and in detail, there may be a plurality of inorganic layers or organic layers, respectively, and the inorganic layers and the organic layers may be alternately deposited. The encapsulation part EN may include at least one of a sandwich structure in which at least one organic layer is inserted between at least two inorganic layers. The inorganic layer disposed at the uppermost layer of the encapsulation part EN may be deposited with a wider area than the organic layer to cover the end part of the organic layer of another layer.

The encapsulation part EN directly contacts the bending region BA of the flexible substrate FS.

Meanwhile, in another exemplary embodiment, the encapsulation part EN may include an opening exposing the bending region BA of the flexible substrate FS, and the bending region of the flexible substrate FS may be exposed by the opening.

Next, the selective bending of the bending region BA of the flexible substrate FS of the display device according to an exemplary embodiment will be described with reference to FIG. 3 and FIG. 4.

Figure 3:
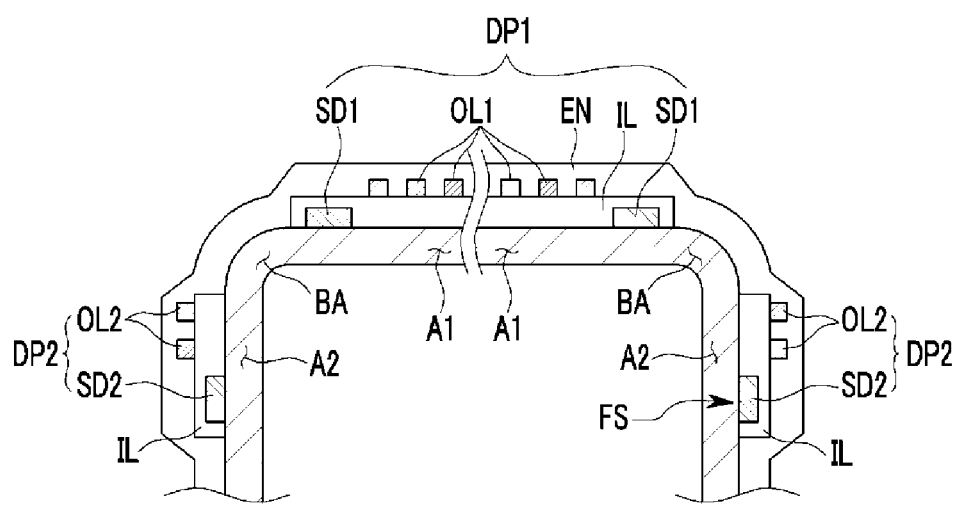
FIG. 3 is a cross-sectional view showing an example of a display device according to an exemplary embodiment.

FIG. 3 is a cross-sectional view of one example of a display device according to an exemplary embodiment.

As shown in FIG. 3, as the bending region BA of the flexible substrate FS of the display device according to an exemplary embodiment is bent to have the curvature, the first region A1 and the second region A2 of the flexible substrate FS may form an angle of substantially 90 degrees. As the first region A1 and the second region A2 of the flexible substrate FS form the angle of substantially 90 degrees, the first display unit DP1 and the second display unit DP2 respectively positioned in the first region A1 and the second region A2 may display the images in the different directions.

Figure 4:
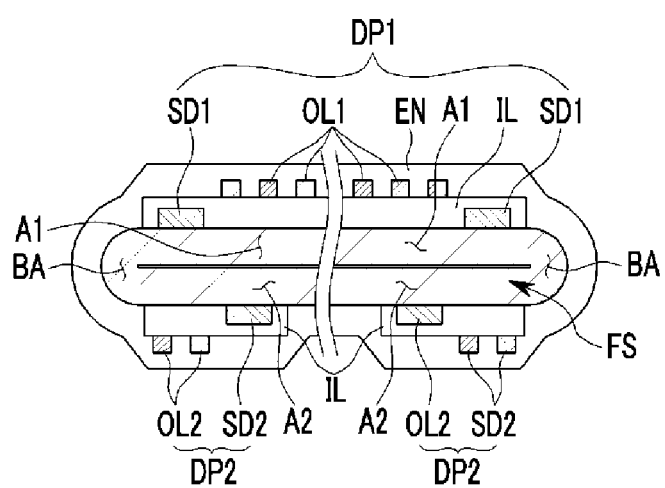
FIG. 4 is a cross-sectional view showing an example of a display device according to another exemplary embodiment

FIG. 4 is a cross-sectional view of another example of a display device according to an exemplary embodiment.

As shown in FIG. 4, as the bending region BA of the flexible substrate FS is bent to have the curvature, the first region A1 and the second region A2 of the flexible substrate FS may form an angle of substantially 0 degrees or 180 degrees. As the first and second regions A1 and A2 form the angle of substantially 0 degrees or 180 degrees, the first and second display units DP1 and DP2 respectively positioned in the first and second regions A1 and A2 may display the images in the different directions.

As described above, as the first display unit DP1 is disposed on the first region A1 of the flexible substrate FS and the second display unit DP2 separated from the first display unit DP1 is disposed on the second region A2, and the bending region BA disposed between the two regions A1 and A2 directly contacts the encapsulation part EN, although the bending region BA is bent. This is because the first display unit DP1 or the second display unit DP2 is not positioned on the bending region BA, the first display unit DP1 or the second display unit DP2 may be prevented from being defective by the stress generated on the bending region BA.

That is, the display device according to an exemplary embodiment includes the flexible substrate FS including the bending region BA having the selective curvature and the first and second display units DP1 and DP2 positioned to be separated from each other on the flexible substrate FS and not overlapping the bending region as the display units, thereby providing the display device in which the defect is suppressed from be generated on the bending region BA as the bending part.

Also, in the display device according to an exemplary embodiment, as the first and second display units DP1 and DP2 respectively include the first and second scan drivers SD1 and SD2, since the wiring does not pass on the bending region BA positioned between the display units DP1 and DP2, although the bending region BA is bent, the wiring positioned on the bending region BA may be basically prevented from being damaged by the stress generated on the bending region BA.

That is, as the first and second display units DP1 and DP2 that do not overlap the bending region BA respectively include the first and second scan drivers SD1 and SD2 as at least one scan driver connected to the organic light-emitting elements, the defect is suppressed on the bending region BA as the bending part is provided.

Also, in the display device according to an exemplary embodiment, as other elements such as the first display unit DP1 or the second display unit DP2 are not positioned on the bending region BA of the flexible substrate FS as the bending part, since the bending region BA of the flexible substrate FS is suppressed from being damaged by other elements, the bending region BA of the flexible substrate FS may be further easily bent.

In short, the display device in which the defect is suppressed from being generated in the bending region BA of the flexible substrate FS as the bending part is provided.

Next, the display device according to another exemplary embodiment will be described with reference to FIG. 5.

Hereafter, differences from the above-described display device according to an exemplary embodiment will be described.

Figure 5:
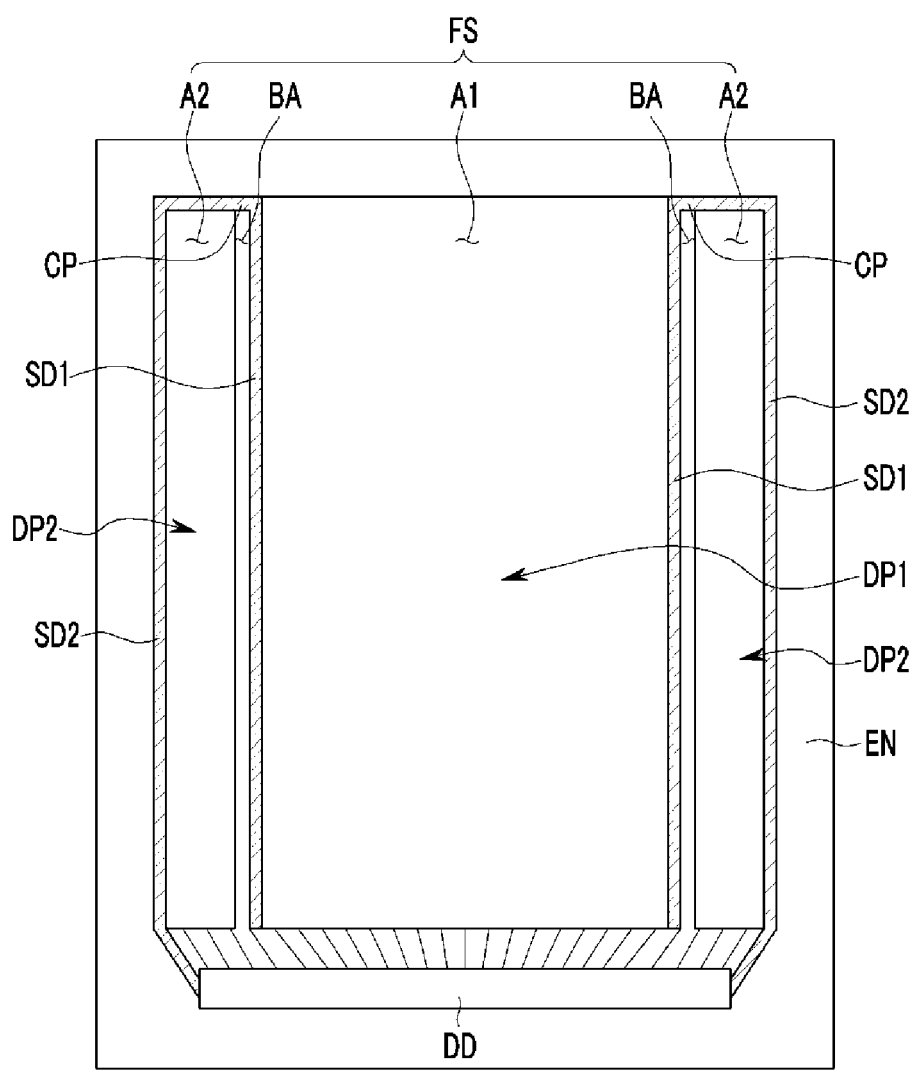
FIG. 5 is a top plan view of a display device according to another exemplary embodiment.

FIG. 5 is a top plan view of a display device according to another exemplary embodiment.

As shown in FIG. 5, the display device includes the flexible substrate FS, the first display unit DP1, the second display unit DP2, the data driver DD, the encapsulation part EN, and a connection part or connector CP.

The connection part CP is positioned at a part of the bending region BA of the flexible substrate FS, and directly connects the first scan driver SD1 of the first display unit DP1 and the second scan driver SD2 of the second display unit DP2. The connection part CP is positioned at the end part of the bending region BA and the connection part CP is positioned at the end part of the bending region BA such that the connection part CP is suppressed from being damaged by the stress generated along the bending part of the bending region BA.

By connecting the first scan driver SD1 and the second scan driver SD2 by the connection part CP, the first scan driver SD1 and the second scan driver SD2 may be formed as one scan driver that is curved and extended, such that the first scan driver SD1 is not connected to the data driver DD.

Meanwhile, in another exemplary embodiment, the first scan driver SD1 is not connected to the data driver DD, however it is not limited thereto, and the first scan driver SD1 may be connected to the data driver DD.

As described above, in another exemplary embodiment, the display device in which the defect is suppressed from being generated in the bending region BA of the flexible substrate FS as the bending part is provided.

Next, the display device according to another exemplary embodiment will be described with reference to FIG. 6.

Figure 6:
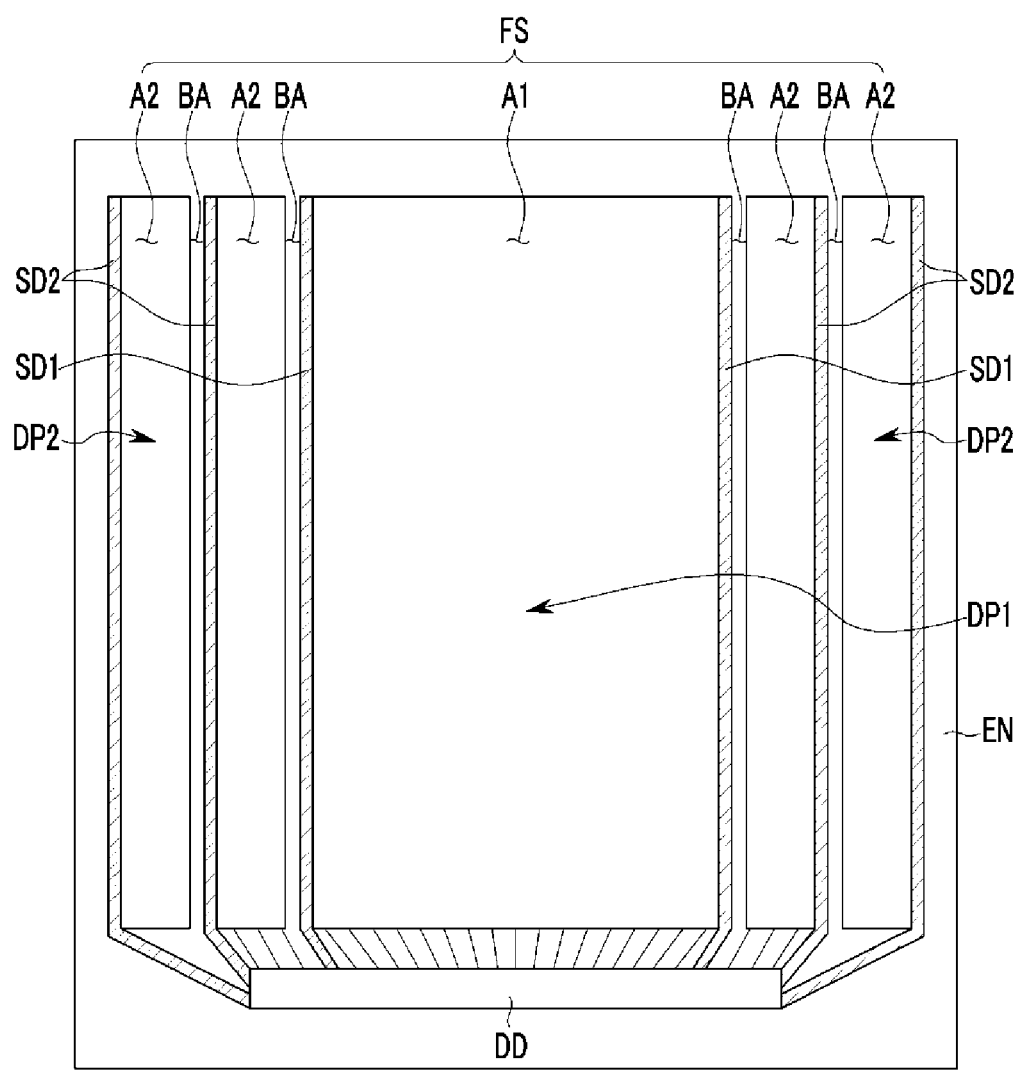
FIG. 6 is a top plan view of a display device according to another exemplary embodiment.

FIG. 6 is a top plan view of a display device according to another exemplary embodiment.

As shown in FIG. 6, the display device includes the flexible substrate FS, the first display unit DP1, four second display units DP2, the data driver DD, and the encapsulation part EN.

As there are a plurality of second regions A2 of the flexible substrate FS, there are a plurality of bending regions BA, and there are a plurality of second display units DP2, the second display units DP2 are respectively separated from each other via at least one among the bending regions BA and are respectively positioned in the plurality of second regions A2. For example, as there are four second regions A2 of the flexible substrate FS, there are four bending regions BA, and there are four second display units DP2, four second display units DP2 are separated from each other via the bending region BA or the bending region BA and the first display unit DP1 and are respectively positioned in four second regions A2.

As one first display unit DP1 includes the first scan driver SD1 and four second display units DP2 respectively include the second scan drivers SD2 different from each other, the first display unit DP1 and the four second display units DP2 may display different images or the same image.

Also, as the bending region BA of the flexible substrate FS is positioned between the first display unit DP1 and four second display units DP2, respectively, if four bending regions BA are bent to have the curvature, the first display unit DP1 and four second display units DP2 may display the image in the different directions.

As described above, in the display device according to another exemplary embodiment, the first display unit DP1 is positioned in the first region A1 of the flexible substrate FS, four second display units DP2 separated from the first display unit DP1 are respectively positioned in four second regions A2, and four bending regions BA directly contact the encapsulation part EN, although the bending region BA is bent, since the first display unit DP1 or the second display unit DP2 is not positioned in the bending region BA, the defect caused by the stress generated in the bending region BA is prevented from being generated in the first display unit DP1 or the second display unit DP2.

Also, in the display device according to another exemplary embodiment, as the first display unit DP1 includes the first scan driver SD1 and the four second display units DP2 respectively include the second scan driver SD2, since the wiring does not pass on the four bending regions BA, although the four bending regions BA are respectively bent, the wiring positioned in the bending region BA may be basically prevented from being damaged by the stress generated in the bending region BA.

Further, in the display device according to another exemplary embodiment, since other elements of the first display unit DP1 or the second display unit DP2 are not positioned on the four bending regions BA of the flexible substrate FS as the bending part, the flexibility of the four bending regions BA of the flexible substrate FS is suppressed from being deteriorated by other elements, thereby further easily bending the four bending regions BA of the flexible substrate FS.

In short, the display device in which the defect is suppressed from being generated in the bending region BA of the flexible substrate FS as the bending part is provided.

Next, the display device according to another exemplary embodiment will be described with reference to FIG. 7.

Figure 7:
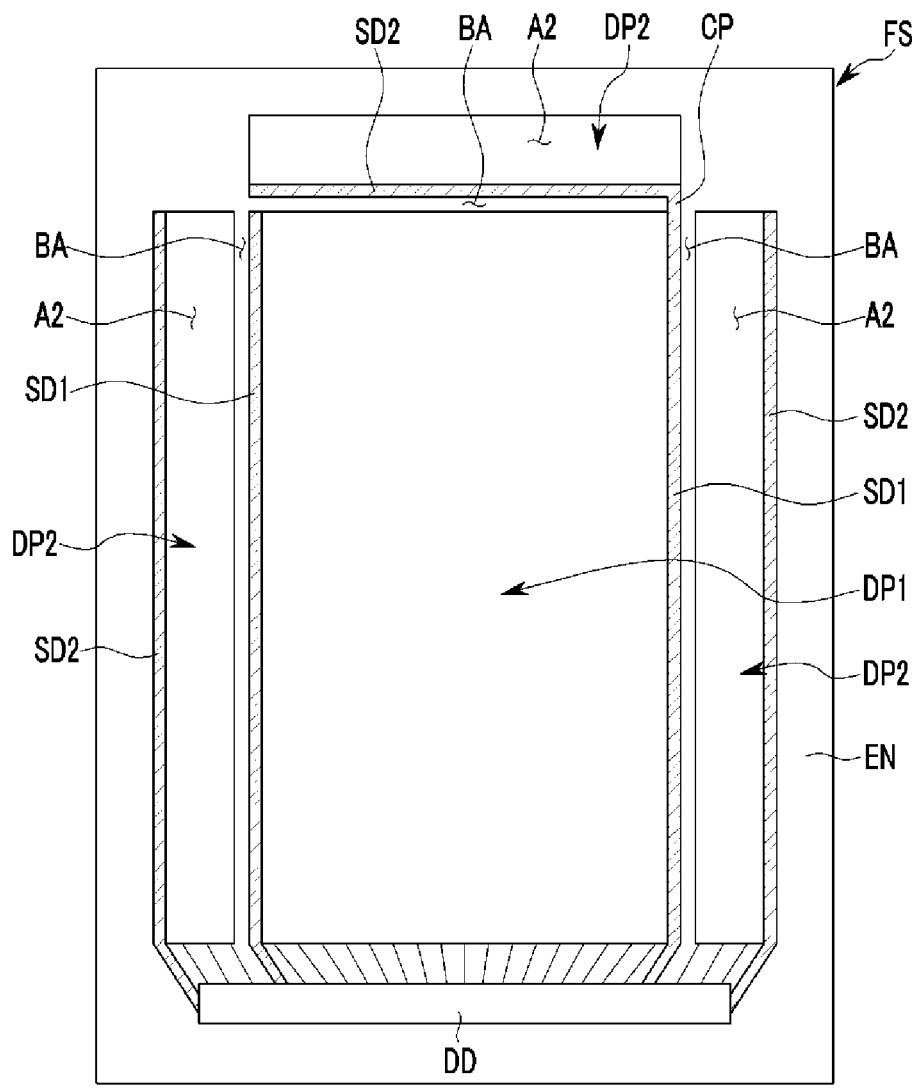
FIG. 7 is a top plan view of a display device according to another exemplary embodiment.

FIG. 7 is a top plan view of a display device according to another exemplary embodiment.

As shown in FIG. 7, the display device includes the flexible substrate FS, the first display unit DP1, three second display units DP2, the data driver DD, the encapsulation part EN, and the connection part CP.

As there are three second regions A2 of the flexible substrate FS, there are three bending regions BA, and there are three second display units DP2, three second display units DP2 are respectively separated from the first display unit DP1 via the bending region BA.

As one first display unit DP1 includes the first scan driver SD1 and the three second display units DP2 respectively include the different second scan drivers SD2, the first display unit DP1 and the three second display units DP2 may respectively display different images or the same image.

Further, as the bending region BA of the flexible substrate FS is positioned between the first display unit DP1 and the three second display units DP2, respectively, if the three bending regions BA are bent to have the curvature, the first display unit DP1 and the three second display units DP2 may respectively display the image in the different directions.

The connection part CP is positioned at the part of the bending region BA of the flexible substrate FS positioned at the upper side of the first display unit DP1 in FIG. 7, and directly connects the first scan driver SD1 of the first display unit DP1 and the second scan driver SD2 of the second display unit DP2 positioned at the upper side of the first display unit DP1. As the connection part CP is positioned on the end part of the bending region BA positioned at the upper side of the first display unit DP1 and the connection part CP is positioned on the end part of the bending region BA, the connection part CP is suppressed from being damaged by the stress generated by the bending of the bending region BA.

By connecting the first scan driver SD1 and the second scan driver SD2 by the connection part CP, the first scan driver SD1 and the second scan driver SD2 may form one scan driver that is curved and extended, such that the second scan driver SD2 of the second display unit positioned at the upper side of the first display unit DP1 is not connected to the data driver DD.

As described above, in the display device according to another exemplary embodiment, as the first display unit DP1 is positioned at the first region A1 of the flexible substrate FS, three second display units DP2 separated from the first display unit DP1 are respectively positioned in three second regions A2, and three bending regions BA directly contact the encapsulation part EN, and although the bending region BA is bent, since the first display unit DP1 or the second display unit DP2 is not positioned at the bending region BA, the defect is suppressed from being generated in the first display unit DP1 or the second display unit DP2 by the stress generated in the bending region BA.

In addition, in the display device according to another exemplary embodiment, as the first display unit DP1 includes the first scan driver SD1 and the three second display units DP2 respectively include the second scan driver SD2, since the wiring does not pass three bending regions BA, although the three bending regions BA are respectively bent, the wiring positioned in the bending region BA is basically prevented from being damaged by the stress generated in the bending region BA.

Further, in the display device according to another exemplary embodiment, as other elements such as the first display unit DP1 or the second display unit DP2 are not positioned on the three bending regions BA of the flexible substrate FS as the bending part, since the flexibility of the three bending regions BA of the flexible substrate FS is suppressed from being deteriorated by other elements, the three bending regions BA of the flexible substrate FS may be further easily bent.

In short, the display device in which the defect is suppressed from being generated in the bending region BA of the flexible substrate FS as the bending part is provided.

Next, the display device according to another exemplary embodiment will be described with reference to FIG. 8.

Figure 8:
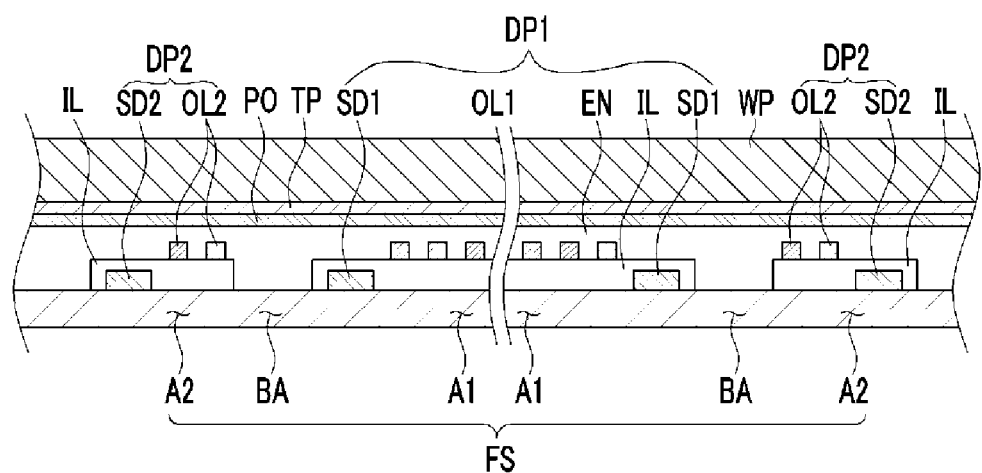
FIG. 8 is a top plan view of a display device according to another exemplary embodiment.

FIG. 8 is a cross-sectional view of a display device according to another exemplary embodiment.

As shown in FIG. 8, the display device according to another exemplary embodiment includes the flexible substrate FS, the first display unit DP1, the second display unit DP2, the data driver DD, the encapsulation part EN, a polarizer PO, a touch part or touch layer TP, and a window WP.

The polarizer PO is positioned on the first display unit DP1 and the second display unit DP2. The polarizer PO may function to suppress external light from being reflected and may include a linear polarizer and a retarder, however it is not limited thereto.

The touch part TP is positioned on the first display unit DP1 and the second display unit DP2. The touch part TP may function to recognize a touch. The touch part TP may be configured as a touch panel, or may be formed on the polarizer PO, the encapsulation part EN, or the window WP.

The window WP is positioned on the first display unit DP1 and the second display unit DP2. The window WP may function to protect the first display unit DP1 and the second display unit DP2 from external interference.

In another exemplary embodiment, the polarizer PO, the touch part TP, and the window WP are sequentially deposited from the first display unit DP1 and the second display unit DP2, however it is not limited thereto, and the polarizer PO, the touch part TP, and the window WP may be respectively deposited in various orders from the first display unit DP1 and the second display unit DP2.

The polarizer PO, the touch part TP, and the window WP may be respectively flexible, such that the entire display device may be flexible.

Next, the display device according to another exemplary embodiment will be described with reference to FIG. 9.

Hereinafter, differences from the above-described exemplary embodiment will be described.

Figure 9:
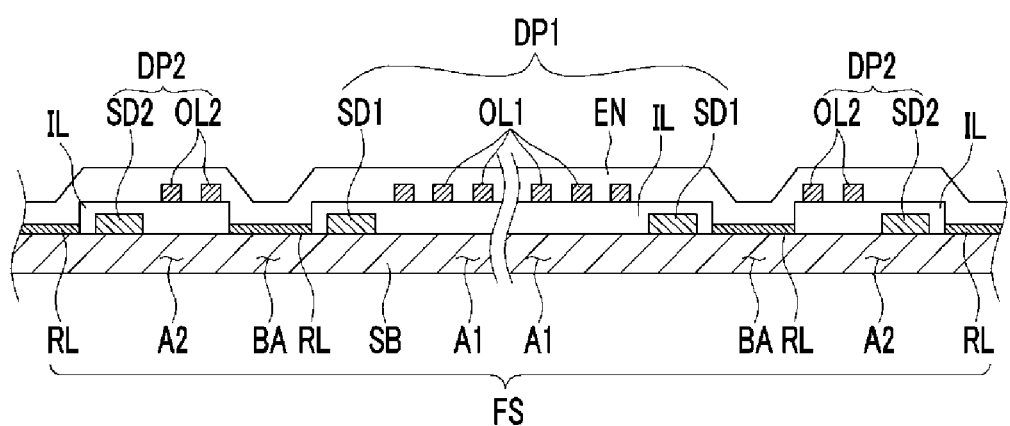
FIG. 9 is a cross-sectional view of a display device according to another exemplary embodiment.

FIG. 9 is a cross-sectional view of a display device according to another exemplary embodiment.

As shown in FIG. 9, the display device according to another exemplary embodiment includes the flexible substrate FS, the first display unit DP1, the second display unit DP2, and the encapsulation unit EN.

The flexible substrate FS includes a substrate body part SB and a residual layer RL corresponding to the bending area BA and positioned on the substrate body part SB.

The residual layer RL includes the same material as the material included in at least one of the first display unit DP1 and the second display unit DP2. In detail, the residual layer RL includes the same material as the material included in at least one among the first scan driver SD1, the insulating layer IL, the first organic light-emitting element OL1, the second scan driver SD2, and the second organic light-emitting element OL2.

As one example, the residual layer RL may include the same material as at least one of an organic material and an inorganic material included in the insulating layer IL, or may include the same material as at least one among common layers such as a hole injection layer, a hole transport layer, an electron injection layer, and an electron transport layer, a cathode, a capping layer, and the like included in the first organic light-emitting element OL1 and the second light-emitting element OL2

The encapsulation unit may be directly in contact with the residual layer RL of the flexible substrate FS while corresponding to the bending area BA.

While the inventive technology has been described in connection with the accompanying drawings, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a flexible substrate including a first region, a second region separated from the first region, and a bending region positioned between the first and second regions, wherein the bending region is configured to be bent so as to have a predetermined curvature;
   a first display unit positioned in the first region;
   a second display unit separated from the first display unit and positioned in the second region; and
   an encapsulation layer positioned over the flexible substrate with the first and second display units interposed therebetween,
   wherein the encapsulation layer directly contacts the flexible substrate in the bending region, and covers an upper surface, a first side surface, and a second side surface opposite to the first side surface of the second display unit.

2. The display device of claim 1, wherein the first display unit includes:
   a plurality of first organic light-emitting elements; and
   a first scan driver electrically connected to the first organic light-emitting elements, and
   wherein the second display unit includes:
   a plurality of second organic light-emitting elements; and
   a second scan driver electrically connected to the second organic light-emitting elements.

3. The display device of claim 2, wherein the first scan driver is, positioned over an end portion of the first display unit, and wherein the second scan driver is positioned over an end portion of the second display unit.

4. The display device of claim 3, further comprising a connector positioned over a portion of the bending region and connecting the first and second scan drivers.

5. The display device of claim 4, wherein the connector is positioned over an end portion of the bending region.

6. The display device of claim 2, wherein the first scan driver comprises a plurality of scan drivers separated from each other via the first organic light-emitting elements.

7. The display device of claim 2, further comprising a data driver positioned over the flexible substrate and electrically connected to the first and second display units.

8. The display device of claim 7, wherein the first and second scan drivers are electrically connected to the data driver.

9. The display device of claim 1, further comprising a data driver positioned over the flexible substrate and electrically connected to the first and second display units.

10. The display device of claim 1, wherein the second region comprises a plurality of second regions, wherein the bending region comprises a plurality of bending regions, wherein the second display unit comprises a plurality of display units separated from each other via at least one of the bending regions to be respectively positioned in the second regions.

11. The display device of claim 1, wherein the first and second display units are configured to respectively display images in different directions from each other.

12. The display device of claim 1, further comprising:
    a polarizer positioned over the first and second display units;
    a touch layer positioned over the first and second display units; and
    a window positioned over the first and second display units.

13. A display device comprising:
    a flexible substrate including a first region, a second region, and a bending region positioned between the first region and the second region, wherein the bending region is configured to be bent so as to have a predetermined curvature;
    a plurality of display units disposed over the flexible substrate and not overlapping the bending region in a direction of the thickness of the flexible substrate, wherein each of the display units includes at least one scan driver; and
    an encapsulation layer overlapping the plurality of display units and directly contacting the flexible substrate in the bending region, wherein the plurality of display units include a first display unit and a second display unit respectively disposed in a first region and a second region,
    wherein the bending region does not include a wire disposed on the flexible substrate, and
    wherein the encapsulation layer directly contacts the flexible substrate in an entire area of the bending region.

14. The display device of claim 13, wherein the encapsulation layer seals the display units along with the flexible substrate.

15. The display device of claim 13, wherein each of scan drivers is directly connected to each other.

16. A display device comprising:
    a flexible substrate including a bending region, wherein the bending region is configured to be bent so as to have a predetermined curvature;
    first and second display units disposed over the flexible substrate not to overlap the bending region in a direction of the thickness of the flexible substrate; and
    an encapsulation layer positioned over the first and second display units, wherein the encapsulation layer directly contacts the bending region of the flexible substrate, and covers an upper surface, a first side surface, and a second side surface opposite to the first side surface of each of the first display unit and the second display unit.

17. The display device of claim 16, wherein the flexible substrate further includes a substrate body and a residual layer positioned on the substrate body while corresponding to the bending region, and the encapsulation layer is directly in contact with the residual layer of the flexible substrate.

18. The display device of claim 17, wherein the residual layer includes the same material as a material included in at least one included in the first display unit and the second display unit.

19. The display device of claim 17, wherein the first display unit includes a plurality of first organic light-emitting elements, and wherein the residual layer includes at least one material included in a plurality of materials included in the plurality of first organic light-emitting elements.

20. The display device of claim 16, wherein the bending region is formed between the first and second display units.

21. The display device of claim 16, wherein the encapsulation layer includes a first portion that overlaps the bending region in the direction of the thickness of the flexible substrate and a second portion that overlaps the first and second display units in the direction of the thickness of the flexible substrate, and wherein the first portion has a top surface that is closer to the flexible substrate than a top surface of the second portion.

* * * * *